US010312424B2

(12) United States Patent
Oh et al.

(10) Patent No.: US 10,312,424 B2
(45) Date of Patent: Jun. 4, 2019

(54) SEMICONDUCTOR LIGHT EMITTING ELEMENT AND BACKLIGHT ASSEMBLY INCLUDING THE SAME

(71) Applicant: LUMENS CO., LTD., Yongin-si, Gyeonggi-do (KR)

(72) Inventors: Seung Hyun Oh, Yongin-si (KR); Yun Geon Cho, Yongin-si (KR); Bo Gyun Kim, Yongin-si (KR); Suk Min Han, Yongin-si (KR); Jun Hyeok Han, Yongin-si (KR); In Woo Son, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/452,217

(22) Filed: Mar. 7, 2017

(65) Prior Publication Data

US 2017/0263831 A1    Sep. 14, 2017

(30) Foreign Application Priority Data

Mar. 14, 2016 (KR) ........................ 10-2016-0030266

(51) Int. Cl.
| | | |
|---|---|---|
| *F21S 4/00* | (2016.01) | |
| *F21V 21/00* | (2006.01) | |
| *H01L 33/60* | (2010.01) | |
| *F21V 19/00* | (2006.01) | |
| *H01L 25/13* | (2006.01) | |
| *H01L 33/48* | (2010.01) | |

(Continued)

(52) U.S. Cl.
CPC .......... *H01L 33/60* (2013.01); *F21V 19/0015* (2013.01); *H01L 25/13* (2013.01); *H01L 33/486* (2013.01); *H01L 33/507* (2013.01); *F21Y 2115/10* (2016.08)

(58) Field of Classification Search
CPC .. F21V 19/0015; F21Y 2115/10; H01L 25/13; H01L 33/486; H01L 33/50; H01L 33/501; H01L 33/502; H01L 33/507; H01L 33/508; H01L 33/60
USPC .......... 362/249.02, 311.02, 800; 257/98–103
See application file for complete search history.

(56) References Cited

U.S. PATENT DOCUMENTS 8,274,156 B2 * 9/2012 Chen ............... H01L 31/022408
                                                      257/459
8,461,610 B2 * 6/2013 Ito .......................... H01L 33/60
                                                      257/100

(Continued)

*Primary Examiner* — Jason M Han
(74) *Attorney, Agent, or Firm* — Mei & Mark LLP

(57) ABSTRACT

Disclosed herein are a semiconductor light emitting element and a backlight assembly including the same. The semiconductor light emitting element includes: a light emitting element chip including a first pad and a second pad and having an upper surface and a side surface; a wavelength conversion layer famed on the upper surface and the side surface of the light emitting element chip; a sidewall reflection part famed to be spaced apart from the side surface of the light emitting element chip; and a bottom surface reflection part famed to protrude at a lower portion of the sidewall reflection part. The sidewall reflection part and the bottom surface reflection part of the light emitting element are configured to reflect light in a direction in which the light penetrates through an upper surface of the wavelength conversion layer, the light being generated from the light emitting element chip.

16 Claims, 5 Drawing Sheets

(51) Int. Cl.
*H01L 33/50* (2010.01)
*F21Y 115/10* (2016.01)

(56) References Cited

U.S. PATENT DOCUMENTS

| | | | | |
|---|---|---|---|---|
| 8,921,877 B2 * | 12/2014 | Ito | ............ | H01L 33/505 257/100 |
| 2014/0203306 A1 * | 7/2014 | Ito | ............ | H01L 33/505 257/88 |

* cited by examiner

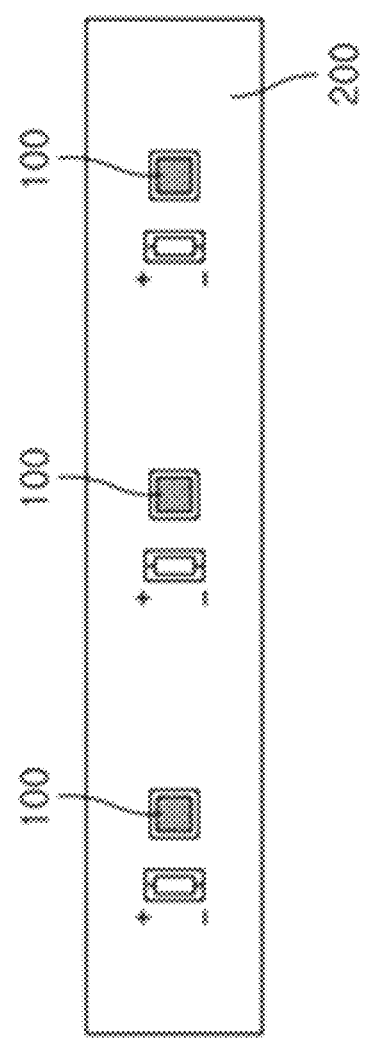

SEMICONDUCTOR LIGHT EMITTING ELEMENT AND BACKLIGHT ASSEMBLY INCLUDING THE SAME

CROSS-REFERENCE TO RELATED APPLICATION(S)

This application claims priority to Korean Patent Application No. 10-2016-0030266, filed on Mar. 14, 2016, the content of which is incorporated herein by reference in its entirety.

BACKGROUND

Field

The present invention relates to a semiconductor light emitting element and a backlight assembly including the same.

Description of the Related Art

A light emitting diode has been spread as an element having low power consumption, decreasing carbon dioxide, having high duration, and saving energy. A package equipped with such an LED chip has been mounted on a wiring substrate (a module substrate) and has been used for a large display, a backlight of an electronic apparatus such as a portable phone, a digital video camera, a personal digital assistants (PDA), or the like, street lighting, general lighting, or the like.

In addition, a chip scale package (CSP) of light emitting device that has approximately the same size as that of a chip has been suggested. Such a light emitting device is a light emitting device having a top view-type mounting form, and has a very thin thickness and may be very effectively used depending on a purpose thereof. In addition, such a light emitting device has been realized to be further thinned by forming a protrusion part on a lead electrode used in a package to improve mass production efficiency.

In such a semiconductor light emitting element, there have been efforts to improve a light diffusion rate.

SUMMARY

An object of the present invention is to provide a semiconductor light emitting element and a backlight assembly including the same.

According to an exemplary embodiment of the present invention, a semiconductor light emitting element may include: a light emitting element chip including a first pad and a second pad and having an upper surface and a side surface; a wavelength conversion layer famed on the upper surface and the side surface of the light emitting element chip; a sidewall reflection part formed to be spaced apart from the side surface of the light emitting element chip; and a bottom surface reflection part formed to protrude at a lower portion of the sidewall reflection part, wherein the sidewall reflection part and the bottom surface reflection part are configured to reflect light in a direction in which the light penetrates through an upper surface of the wavelength conversion layer, the light being generated from the light emitting element chip. In an aspect, the light emitting element chip may include a flip-type light emitting element chip.

One surface of the sidewall reflection part may be parallel with the side surface of the light emitting element chip.

The wavelength conversion layer may include: a sidewall wavelength conversion part positioned in a side surface space part formed between the sidewall reflection part and the side surface of the light emitting element chip; and a main surface wavelength conversion part positioned on the upper surface of the light emitting element chip.

The light emitting element chip may include: a first semiconductor layer having a first polarity; a second semiconductor layer having a second polarity; and an active layer disposed between the first semiconductor layer and the second semiconductor layer, and a height of the bottom surface reflection part may be equal to or higher than that of the active layer.

The bottom surface reflection part may have an arc shape. The bottom surface reflection part may satisfy the following Equation:

$$1d \leq R \leq 20d$$

where R is a radius of the bottom surface reflection part, and d is a distance between the light emitting element chip and the sidewall reflection part (0.1 mm≤d≤3 mm).

According to another exemplary embodiment of the present invention, a backlight assembly may include a circuit board; and a semiconductor light emitting element installed on the circuit board, wherein the semiconductor light emitting element includes: a flip-type light emitting element chip including a first pad and a second pad and having an upper surface and a side surface; a wavelength conversion layer formed on the upper surface and the side surface of the light emitting element chip; a sidewall reflection part formed to be spaced apart from the side surface of the light emitting element chip; and a bottom surface reflection part formed to protrude at a lower portion of the sidewall reflection part, and the sidewall reflection part and the bottom surface reflection part are configured to reflect light in a direction in which the light penetrates through an upper surface of the wavelength conversion layer, the light being generated from the light emitting element chip.

The wavelength conversion layer may include: a sidewall wavelength conversion part positioned in a side surface space part formed between the sidewall reflection part and the side surface of the light emitting element chip; and a main surface wavelength conversion part positioned on the upper surface of the light emitting element chip.

BRIEF DESCRIPTION OF THE DRAWINGS

FIG. 5 is a view illustrating an example of a backlight assembly in which the semiconductor light emitting elements according to an exemplary embodiment of the present invention are installed.

DETAILED DESCRIPTION

Figure 1:
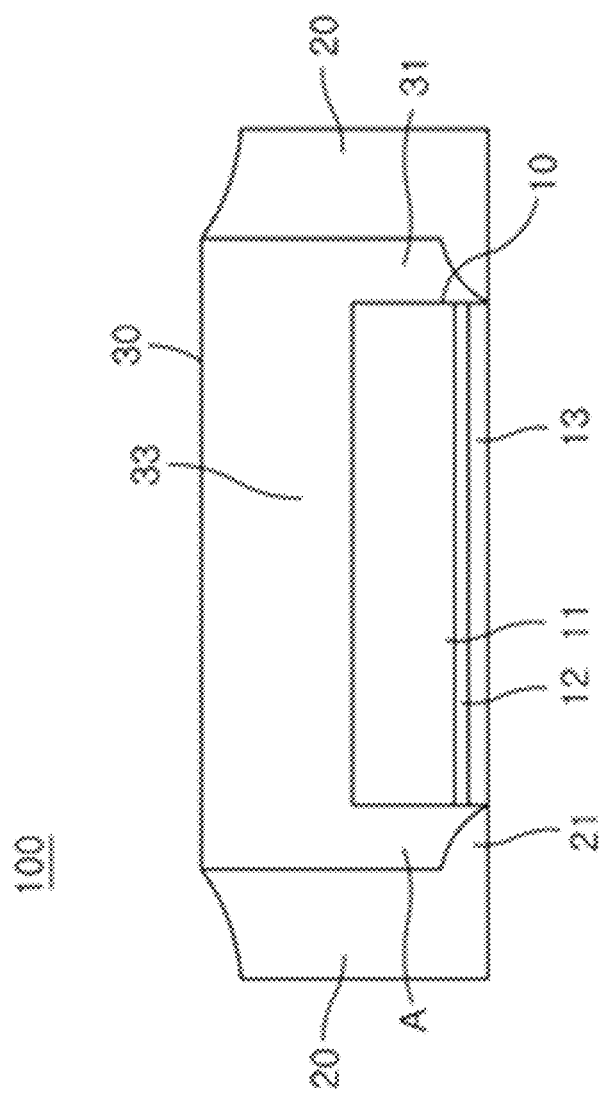
FIG. 1 is a cross-sectional view of a semiconductor light emitting element according to an exemplary embodiment of the present invention.

Hereinafter, a semiconductor light emitting element and a backlight assembly including the same according to an exemplary embodiment of the present invention will be described in detail with reference to the accompanying drawings. Throughout the present invention, components that are the same as or similar to each other will be denoted by reference numerals that are the same as or similar to each other and a description therefor will be replaced by the first description, in different exemplary embodiments.

Figure 2:
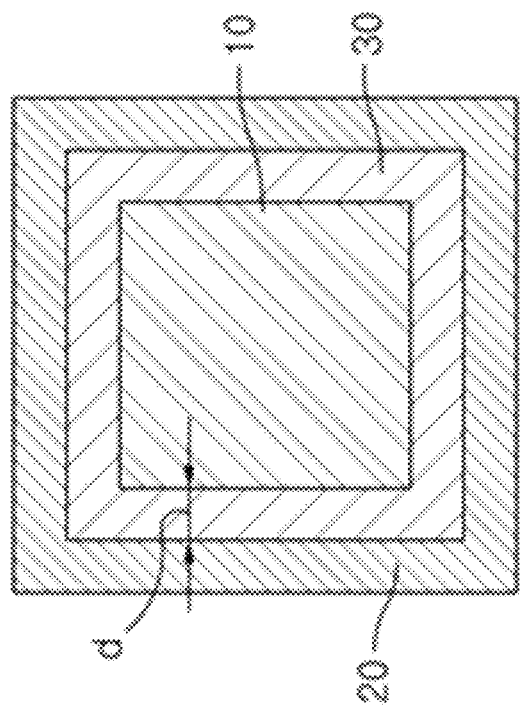
FIG. 2 is a plan view of the semiconductor light emitting element according to an exemplary embodiment of the present invention.

FIG. 1 is a cross-sectional view of a semiconductor light emitting element according to an exemplary embodiment of the present invention, and FIG. 2 is a plan view of the semiconductor light emitting element according to an exemplary embodiment of the present invention.

As illustrated in FIG. 1, the semiconductor light emitting element according to an exemplary embodiment of the present invention may be configured to include a light emitting element chip 10, a sidewall reflection part 20, and a wavelength conversion layer 30.

The light emitting element chip 10, which is formed of a semiconductor element emitting light using electric energy, may be a chip scale package (CSP) or a wafer level package (WLP) in the present invention. That is, the light emitting element chip 10 may be a flip-type light emitting element chip including first and second pads directly contacting power supplying terminals of a circuit board.

The light emitting element chip 10 may be configured to include a first semiconductor layer 11 having a first polarity, a second semiconductor layer 13 having a second polarity, and an active layer 12 positioned between the first semiconductor layer 11 and the second semiconductor layer 13. The semiconductor layers may be formed of BN, SiC, ZnSe, GaN, InGaN, InAlGaN, AlGaN, BAlGaN, BInAlGaN, or the like.

The light emitting element may be a blue light emitting element in consideration of a light output, and a light emitting layer of the blue light emitting element may be famed of a nitride semiconductor made of $In_xAl_yGa_{1-x-y}N$ ($0 \leq x \leq 1$, $0 \leq y \leq 1$, and $x+y \leq 1$), and may be formed in a single or multi quantum well structure to improve a light output.

The sidewall reflection part (a white wall) 20, which is a component reflecting light output from the light emitting element chip 10 toward an output, is installed to have a predetermined internal (a side surface space part A), as illustrated in FIG. 1. The sidewall reflection part 20 serves to reflect light irradiated from the light emitting element chip 10 toward an output part. That is, the sidewall reflection part is generally parallel with side surfaces of the light emitting element chip 10, but may be configured to include a bottom surface reflection part 21 famed in a bottom surface thereof so as to contact the light emitting element chip 10. Particularly, the bottom surface reflection part 21 may be formed in an arc shape at a height higher than that of the active layer 12. The height of the bottom surface reflection part 21 is higher than that of the active layer 12, such that light emitted from the active layer 12 is reflected from the bottom surface reflection part 21 toward the output. This will be described in more detail in reference to FIG. 3.

The wavelength conversion layer 30 may have a structure in which it covers upper portions of the side surface space part A of the light emitting element chip 10. In the case in which the wavelength conversion layer 30 is famed of a phosphor changing a wavelength of the light emitted from the light emitting element chip 10 depending on a purpose, the wavelength conversion layer 30 may contain any one selected from the group consisting of yttrium aluminum garnet (YAG), terbium aluminum garnet (TAG), lutetium aluminum garnet (LuAG), silicate, nitride, oxynitride, and sulfide, or a combination thereof.

In the present invention, the wavelength conversion layer may be configured to include a sidewall wavelength conversion part 31 filled in the side surface space part A and a main surface wavelength conversion part 33 covering a main surface of the light emitting element chip.

Here, the sidewall wavelength conversion part 31 may be formed by injecting a fluorescent material into the sidewall reflection part 20. That is, the main surface wavelength conversion part 33 and the sidewall wavelength conversion part 31 may be formed by forming the sidewall reflection part 20 so as to be spaced apart from the light emitting element chip 10, applying a fluorescent material to the main surface wavelength conversion part 33, and then filling the fluorescent material into the side surface space part A through the injection.

Therefore, the light generated from the light emitting element chip 10 is not directly reflected on the sidewall reflection part 20, but is primarily refracted while passing through the sidewall wavelength conversion part 31 and again secondarily passes by the sidewall reflection part 20, thereby making light diffusivity excellent and assisting in improvement of an amount of light.

A plan view of the semiconductor light emitting element is illustrated in FIG. 2. As illustrated in FIG. 2, the semiconductor light emitting element generally has a square or rectangular shape, and has a form in which the wavelength conversion layer 30 surrounds the light emitting element chip and the sidewall reflection part 20 surrounds the wavelength conversion layer 30.

Hereinafter, the bottom surface reflection part 21 will be described in more detail in reference to FIG. 3.

Figure 3:
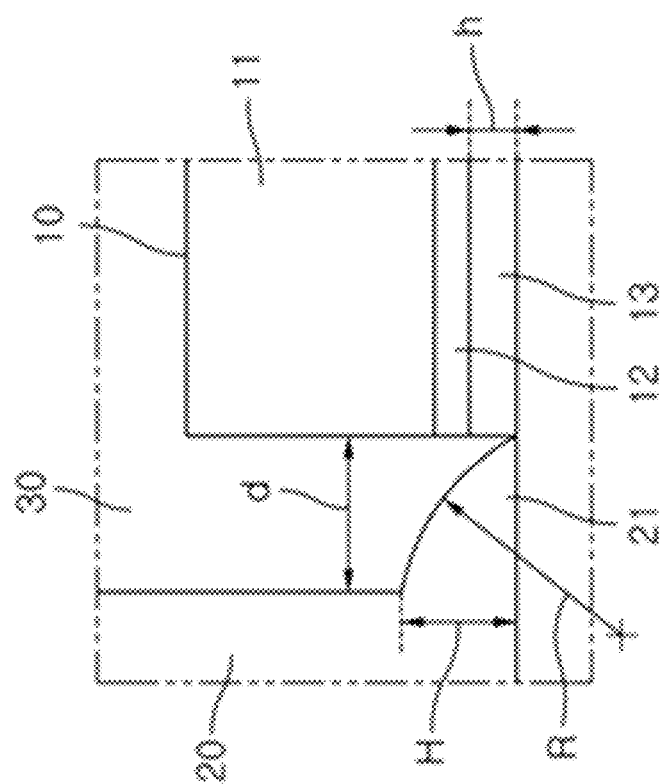
FIG. 3 is a partially enlarged view of a bottom surface reflection part of the semiconductor light emitting element according to an exemplary embodiment of the present invention.

FIG. 3 is a partially enlarged view of a bottom surface reflection part of the semiconductor light emitting element according to an exemplary embodiment of the present invention. As illustrated in FIG. 3, a height of the bottom surface reflection part 21 is equal to or higher than that of the light emitting element chip 10. Here, when a distance between the light emitting element chip 10 and the sidewall reflection part 20 is d and a radius of the bottom surface reflection part having the arc shape is R, the following Equation is satisfied:

$$1d \leq R \leq 20d$$

Here, R is a radius of the bottom surface reflection part 21, and d is a distance between the light emitting element chip and the sidewall reflection part (0.1 mm ≤ d ≤ 3 mm).

In the case in which d is 0.2 mm, the active layer 12 has a height of approximately 10 μm (0.01 mm). When considering this, in the case in which R is greater than 20 d, the height of the bottom surface reflection part 21 is lower than that of the active layer 12, such that a light diffusion rate is not improved. In addition, in the case in which R is smaller than d, a rate in which the reflected light passes through the side surfaces of the light emitting element chip 10 is increased, such that a light diffusion rate is decreased.

Figure 4B:
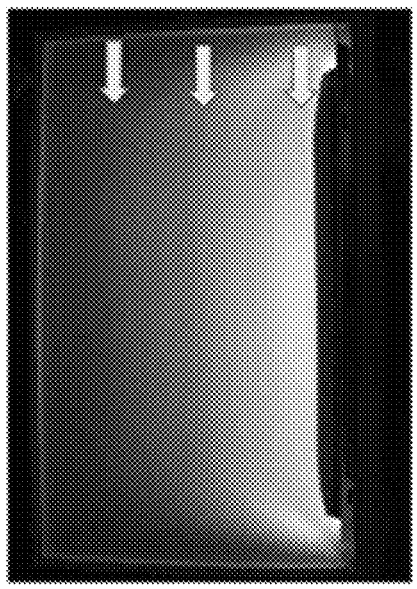
FIGS. 4A and 4B are images for illustrating improvement of a light diffusion rate of the semiconductor light emitting element according to an exemplary embodiment of the present invention.
Figure 4A:
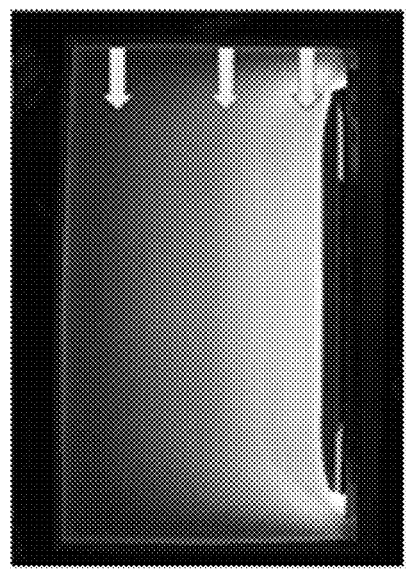

FIGS. 4A and 4B are images for illustrating improvement of a light diffusion rate of the semiconductor light emitting element according to an exemplary embodiment of the present invention. FIG. 4A is an image for Yellowshi evaluation of an example in which the light emitting element chip and the sidewall reflection part contact each other, and FIG. 4B is an image for Yellowshi evaluation of an exemplary embodiment of the present invention.

As illustrated, it may be appreciated that a light diffusion rate of FIG. 4B is better than that of FIG. 4A. The reason is that a light diffusion rate and an amount of light are increased by disposing the sidewall reflection part 20 so as to be spaced apart from the light emitting element chip and reflecting light directed downwardly toward the output through the bottom surface reflection part 21.

Hereinafter, an example of a backlight assembly in which the semiconductor light emitting element described above is installed will be described.

FIG. 5 is a view illustrating an example of a backlight assembly in which the semiconductor light emitting elements according to an exemplary embodiment of the present invention are installed. As illustrated in FIG. 5, the semiconductor light emitting elements 100 described above are installed at predetermined intervals on a backlight circuit board 200 having a long band shape.

As described above, the semiconductor light emitting elements 100 according to an exemplary embodiment of the present invention are installed on the backlight circuit board 200, such that a manufacturing cost is decreased, and visibility of a display module is finally improved.

According to an exemplary embodiment of the present invention, light primarily refracted while passing through a fluorescent part sidewall part formed at a sidewall again secondarily passes through a main surface phosphor, which is advantageous in light diffusion and results in improvement of an amount of light.

In addition, according to an exemplary embodiment of the present invention, some of the light output from the active layer is reflected by the bottom surface reflection part of the sidewall reflection part and is then output toward the output, which assists in improvement of an amount of light.

The semiconductor light emitting element and the backlight assembly including the same as described above are not restrictively applied to the configurations and the methods of the exemplary embodiments described above, but all or some of the exemplary embodiments may be selectively combined with each other so that various modifications may be made.

What is claimed is:

1. A semiconductor light emitting element comprising:
a light emitting element chip including a first pad, a second pad, an upper surface and a side surface;
a wavelength conversion layer formed on the upper surface and the side surface of the light emitting element chip;
a sidewall reflection part having an inner surface facing the light emitting element chip, the inner surface being parallel to the side surface of the light emitting element chip and being spaced apart from the side surface of the light emitting element chip; and
a bottom surface reflection part protruding from a lower portion of the sidewall reflection part and having an arc shape,
wherein the sidewall reflection part and the bottom surface reflection part are configured to reflect light in a direction in which the light penetrates through an upper surface of the wavelength conversion layer, the light being generated from the light emitting element chip,
wherein the light emitting element chip includes:
a first semiconductor layer having a first polarity;
a second semiconductor layer having a second polarity and disposed lower than the first semiconductor layer; and
an active layer disposed between the first semiconductor layer and the second semiconductor layer,
wherein a height of the bottom surface reflection part is equal to or greater than that of the active layer, and wherein a bottom surface of the second semiconductor layer is exposed to a lower side of the semiconductor light emitting element.

2. The semiconductor light emitting element of claim 1, wherein the wavelength conversion layer includes:
a sidewall wavelength conversion part positioned in a side surface space part formed between the sidewall reflection part and the side surface of the light emitting element chip; and
a main surface wavelength conversion part positioned on the upper surface of the light emitting element chip.

3. The semiconductor light emitting element of claim 1, wherein the bottom surface reflection part satisfies the following Equation:

$$1d \leq R \leq 20d$$

where R is a radius of the bottom surface reflection part, and d is a distance between the light emitting element chip and the sidewall reflection part (0.1 mm≤d≤0.3 mm).

4. The semiconductor light emitting element of claim 1, wherein the light emitting element chip comprises a flip-type light emitting element chip.

5. The semiconductor light emitting element of claim 1, wherein a portion of the wavelength conversion layer is disposed between the inner surface of the sidewall reflection part and the side surface of the light emitting element chip.

6. The semiconductor light emitting element of claim 1, wherein the inner surface of the sidewall reflection part is in contact with the wavelength conversion layer.

7. A backlight assembly comprising:
a circuit board; and
a semiconductor light emitting element installed on the circuit board,
wherein the semiconductor light emitting element includes:
a light emitting element chip including a first pad, a second pad, an upper surface and a side surface;
a wavelength conversion layer formed on the upper surface and the side surface of the light emitting element chip;
a sidewall reflection part having an inner surface facing the light emitting element chip, the inner surface being parallel to the side surface of the light emitting element chip and being spaced apart from the side surface of the light emitting element chip; and
a bottom surface reflection part protruding from a lower portion of the sidewall reflection part and having an arc shape, and
wherein the sidewall reflection part and the bottom surface reflection part are configured to reflect light in a direction in which the light penetrates through an upper surface of the wavelength conversion layer, the light being generated from the light emitting element chip,
wherein the light emitting element chip includes:
a first semiconductor layer having a first polarity;
a second semiconductor layer having a second polarity and disposed lower than the first semiconductor layer; and
an active layer disposed between the first semiconductor layer and the second semiconductor layer,
wherein a height of the bottom surface reflection part is equal to or greater than that of the active layer, and wherein a bottom surface of the second semiconductor layer contacts directly with an upper side of the circuit board.

8. The backlight assembly of claim 7, wherein the wavelength conversion layer includes:
a sidewall wavelength conversion part positioned in a side surface space part formed between the sidewall reflection part and the side surface of the light emitting element chip; and
a main surface wavelength conversion part positioned on the upper surface of the light emitting element chip.

9. The backlight assembly of claim 7, wherein the light emitting element chip comprises a flip-type light emitting element chip.

10. The backlight assembly of claim 7, wherein a portion of the wavelength conversion layer is disposed between the inner surface of the sidewall reflection part and the side surface of the light emitting element chip.

11. The backlight assembly of claim 7, wherein the inner surface of the sidewall reflection part is in contact with the wavelength conversion layer.

12. A semiconductor light emitting element comprising:
a light emitting element chip including a first pad, a second pad, an upper surface and a side surface;
a wavelength conversion layer formed on the upper surface and the side surface of the light emitting element chip;
a sidewall reflection part having an inner surface in contact with the wavelength conversion layer, the inner surface being parallel to the side surface of the light emitting element chip and being spaced apart from the side surface of the light emitting element chip with the wavelength conversion layer being disposed between the inner surface of the sidewall reflection part and the side surface of the light emitting element; and
a bottom surface reflection part protruding from a lower portion of the sidewall reflection part towards the light emitting element chip,
wherein the light emitting element chip includes:
a first semiconductor layer having a first polarity;
a second semiconductor layer having a second polarity and disposed lower than the first semiconductor layer; and
an active layer disposed between the first semiconductor layer and the second semiconductor layer,
wherein a height of the bottom surface reflection part is equal to or higher than that of the active layer, and
wherein a bottom surface of the second semiconductor layer is exposed to a lower side of the semiconductor light emitting element.

13. The semiconductor light emitting element of claim 12, wherein the bottom surface reflection part has an arc shape.

14. The semiconductor light emitting element of claim 12, wherein the wavelength conversion layer includes:
a sidewall wavelength conversion part positioned in a side surface space part formed between the sidewall reflection part and the side surface of the light emitting element chip; and
a main surface wavelength conversion part positioned on the upper surface of the light emitting element chip.

15. The semiconductor light emitting element of claim 12, wherein the bottom surface reflection part satisfies the following Equation:

$$1d \leq R \leq 20d$$

where R is a radius of the bottom surface reflection part, and d is a distance between the light emitting element chip and the sidewall reflection part.

16. The semiconductor light emitting element of claim 12, wherein the light emitting element chip comprises a flip-type light emitting element chip.

* * * * *